United States Patent
Wang

(10) Patent No.: US 11,669,018 B2
(45) Date of Patent: *Jun. 6, 2023

(54) SIMULATION-ASSISTED ALIGNMENT BETWEEN METROLOGY IMAGE AND DESIGN

(71) Applicant: ASML NETHERLANDS B.V., Veldhoven (NL)

(72) Inventor: Te-Sheng Wang, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 47 days.

This patent is subject to a terminal disclaimer.

(21) Appl. No.: 17/338,927

(22) Filed: Jun. 4, 2021

(65) Prior Publication Data

US 2021/0294219 A1 Sep. 23, 2021

Related U.S. Application Data

(63) Continuation of application No. 16/467,675, filed as application No. PCT/EP2017/081695 on Dec. 6, 2017, now Pat. No. 11,029,609.

(Continued)

(51) Int. Cl.
  *G03F 7/20* (2006.01)
  *G03F 7/00* (2006.01)
(52) U.S. Cl.
  CPC .......... *G03F 7/705* (2013.01); *G03F 7/7065* (2013.01); *G03F 7/70433* (2013.01); *G03F 7/70616* (2013.01)
(58) Field of Classification Search
  CPC .... G03F 7/705; G03F 7/70433; G03F 7/7065; G03F 7/70616
  See application file for complete search history.

(56) References Cited

U.S. PATENT DOCUMENTS 6,091,845 A  7/2000  Pierrat et al.
6,159,609 A * 12/2000  Evers ............... H01L 24/27
                                                428/338

(Continued)

FOREIGN PATENT DOCUMENTS

KR    20050010392    1/2005
TW       201535054    9/2015
TW       201614382    4/2016

OTHER PUBLICATIONS

International Search Report and Written Opinion issued in corresponding PCT Patent Application No. PCT/EP2017/081695, dated Apr. 6, 2018.

(Continued)

*Primary Examiner* — Stacy Whitmore
(74) *Attorney, Agent, or Firm* — Pillsbury Winthrop Shaw Pittman LLP

(57) ABSTRACT

A method including: simulating an image or characteristics thereof, using characteristics of a design layout and of a patterning process, determining deviations between the image or characteristics thereof and the design layout or characteristics thereof; aligning a metrology image obtained from a patterned substrate and the design layout based on the deviations, wherein the patterned substrate includes a pattern produced from the design layout using the patterning process; and determining a parameter of a patterned substrate from the metrology image aligned with the design layout.

24 Claims, 8 Drawing Sheets

Related U.S. Application Data

(60) Provisional application No. 62/439,690, filed on Dec. 28, 2016.

(56) References Cited

U.S. PATENT DOCUMENTS

| | | | |
|---|---|---|---|
| 7,587,704 | B2 | 9/2009 | Ye et al. |
| 8,296,687 | B2 | 10/2012 | Strang |
| 9,659,670 | B2 | 5/2017 | Choi |
| 9,865,512 | B2 | 1/2018 | Jayaraman |
| 9,910,953 | B2 | 3/2018 | Adel |
| 11,029,609 | B2 * | 6/2021 | Wang .................. G03F 7/705 |
| 2004/0102934 | A1 | 5/2004 | Chang |
| 2004/0199349 | A1 | 10/2004 | Ivanovic et al. |
| 2011/0202893 | A1 | 8/2011 | Kusnadi et al. |
| 2011/0202898 | A1 | 8/2011 | Kusnadi et al. |
| 2014/0351773 | A1 | 11/2014 | Cao et al. |
| 2016/0061589 | A1 | 3/2016 | Bhattacharyya et al. |
| 2016/0372303 | A1 | 12/2016 | Park et al. |

OTHER PUBLICATIONS

Taiwanese Office Action issued in corresponding Taiwanese Patent Application No. 106145924, dated Oct. 2, 2018.
Weisbuch, Francois, et al.: "Determination of CD variance factors of 28nm 1x-Metal layer hotspots using experimental and simulated CD contours", Proc. of SPIE, vol. 8166, No. 1, Nov. 3, 2011.
Mulkens, Jan, et.al.: "Overlay and edge placement control strategies for the 7nm node using EUV and ArF lithograghy", Proc. of SPIE, vol. 9422, Mar. 13, 2015.
Korean Office Action issued in corresponding Korean Patent Application No. 10-2019-7022186, dated Oct. 25, 2020.

* cited by examiner

SIMULATION-ASSISTED ALIGNMENT BETWEEN METROLOGY IMAGE AND DESIGN

This application is a continuation of U.S. patent application Ser. No. 16/467,675, filed Jun. 7, 2019, which is the U.S. national phase entry of PCT patent application no. PCT/EP2017/081695, which was filed on Dec. 6, 2017, which claims the benefit of priority of U.S. provisional application No. 62/439,690, which was filed on Dec. 28, 2016, each of the foregoing applications is incorporated herein in its entirety by reference.

FIELD

The present disclosure relates to a method and apparatus for measuring patterns formed by a patterning process on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices. In that instance, a patterning device, which is alternatively referred to as a mask or a reticle, may be used to generate a pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor one or more steps of a patterning process (i.e., a process of device manufacturing involving lithography, including, e.g., resist-processing, etching, development, baking, etc.), the patterned substrate is inspected and one or more parameters of the patterned substrate are determined. The one or more parameters may include, for example, edge placement errors (EPEs), which are distances between edges of patterns formed on the substrate and corresponding edges of the intended design of the patterns. This measurement may be performed on patterns of the product substrate itself and/or on a dedicated metrology target provided on the substrate. There are various techniques for making measurements of the microscopic structures formed in a patterning process, including the use of a scanning electron microscope (SEM) and/or various specialized tools.

SUMMARY

In an aspect, there is provided a method comprising: simulating an image or characteristics thereof, using characteristics of a design layout and of a patterning process, determining deviations between the image or characteristics thereof and the design layout or characteristics thereof; aligning a metrology image obtained from a patterned substrate and the design layout based on the deviations, wherein the patterned substrate comprises patterns produced from the design layout using the patterning process; and determining a parameter of a patterned substrate from the metrology image aligned with the design layout.

According to an embodiment, the method further comprises adjusting the design layout, a patterning device comprising the design layout, or the patterning process based on the parameter.

According to an embodiment, simulating the image or characteristics thereof further comprises using characteristics of a resolution enhancement technique or characteristics of a patterning device.

According to an embodiment, the resolution enhancement technique is configured to place an assist feature into the design layout.

According to an embodiment, the characteristics of the patterning device comprise a deformation of patterns on the patterning device.

According to an embodiment, the deviations are between mapping references of the design layout and corresponding mapping references of the image.

According to an embodiment, the mapping references comprise an edge in a contour.

According to an embodiment, the image is an aerial image, a resist image or an etched image.

According to an embodiment, the deviations comprise an edge placement error.

According to an embodiment, the metrology image is a scanning electron microscopy image.

According to an embodiment, the metrology image is a pixelated image.

According to an embodiment, aligning the metrology image and the design layout comprises identifying contours from the metrology image.

According to an embodiment, aligning the metrology image and the design layout comprises: determining weights for the deviations based on characteristics of the deviations; computing a cost function that characterizes at least some of the deviations and is a function of a mapping between the design layout and the metrology image; adjusting the mapping based on the cost function; and aligning the metrology image and the design layout using the mapping.

According to an embodiment, the characteristics of the deviations comprise a magnitude of the deviations.

According to an embodiment, adjusting the mapping based on the cost function comprises adjusting the mapping such that the cost function is minimized or maximized.

According to an embodiment, at least some of the weights are zero.

According to an embodiment, the mapping represents one or more relative deformations between the metrology image and the design layout.

In an aspect, there is provided a non-transitory computer program product comprising machine-readable instructions for causing a processor to cause performance of any of the above methods.

DETAILED DESCRIPTION

Before describing embodiments in detail, it is instructive to present an example environment in which embodiments may be implemented.

Figure 1:
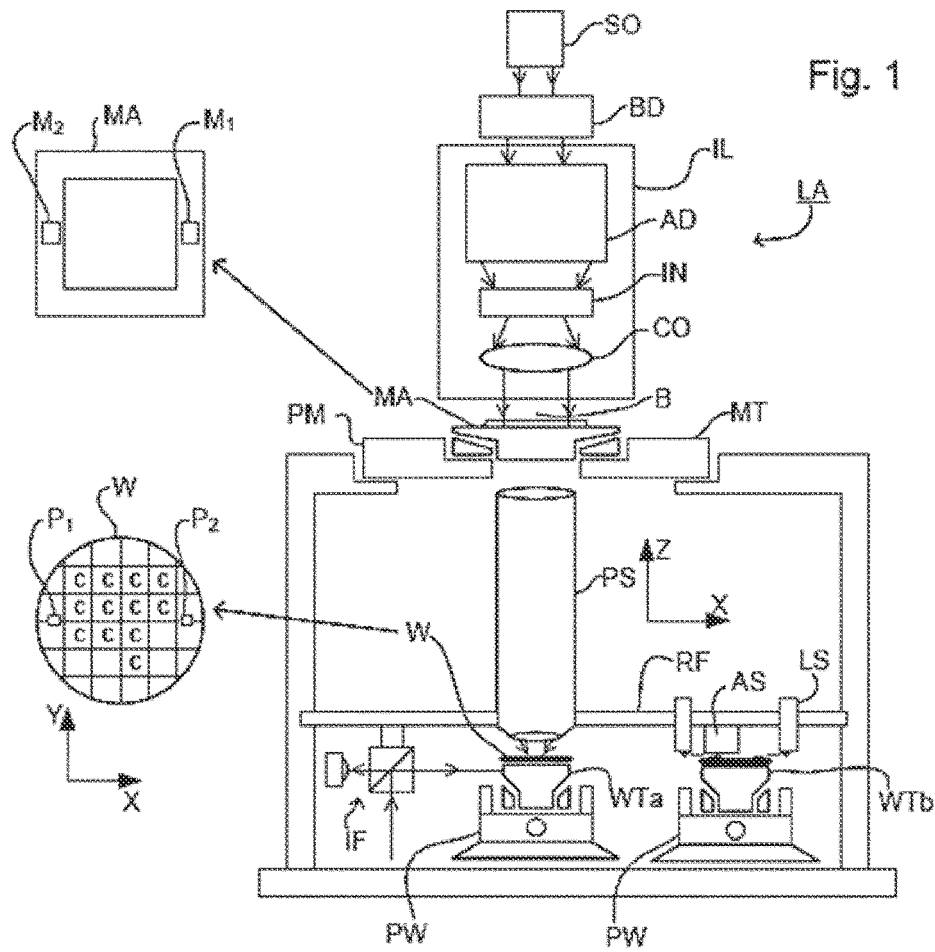
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
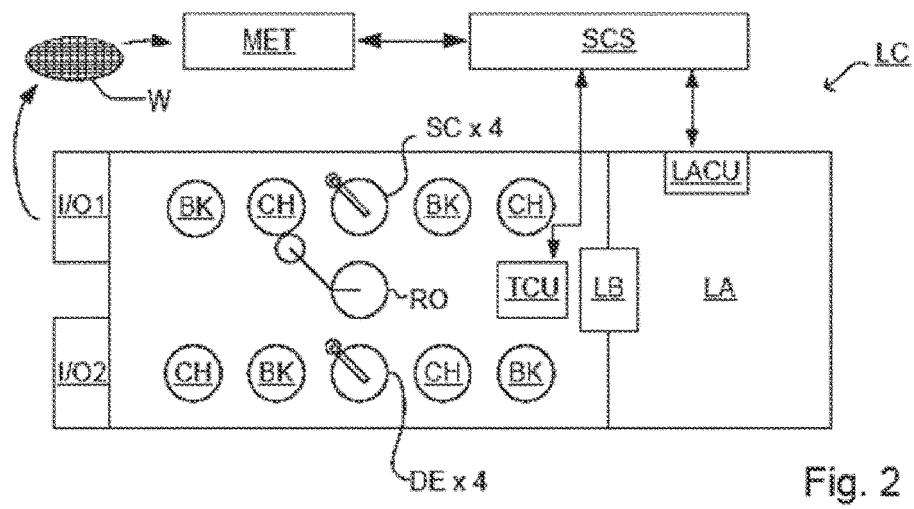
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is patterned by the lithographic apparatus is done so correctly and consistently, it is desirable to inspect a patterned substrate to measure one or more properties such as EPEs, line thickness, critical dimension (CD), etc. Accordingly a manufacturing facility in which the lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to patterning of a subsequent substrate (especially if the inspection can be done soon and fast enough that one or more other substrates of the batch are still to be patterned) and/or to subsequent patterning of the patterned substrate. Also, an already patterned substrate may be stripped and reworked to improve yield, or discarded, thereby avoiding performing further processing on a substrate known to be faulty. In a case where only some target portions of a substrate are faulty, further patterning may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measures one or more properties in the patterned resist layer immediately after the patterning. However, for example, a latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

The inspection of a substrate patterned in a patterning process may involve capturing images (e.g., scanning electron microscopy images) of the substrate. Some parameters of the patterned substrate may be extracted from the images alone but other parameters may require comparison with other data, such as the design layout of the patterns formed on the substrate.

Comparing the design layout to an image is not always straightforward. The image may have to be aligned to the design layout before the comparison. Errors in the alignment may lead to errors in the parameters of the patterned substrate measured by the metrology system.

Figure 3:
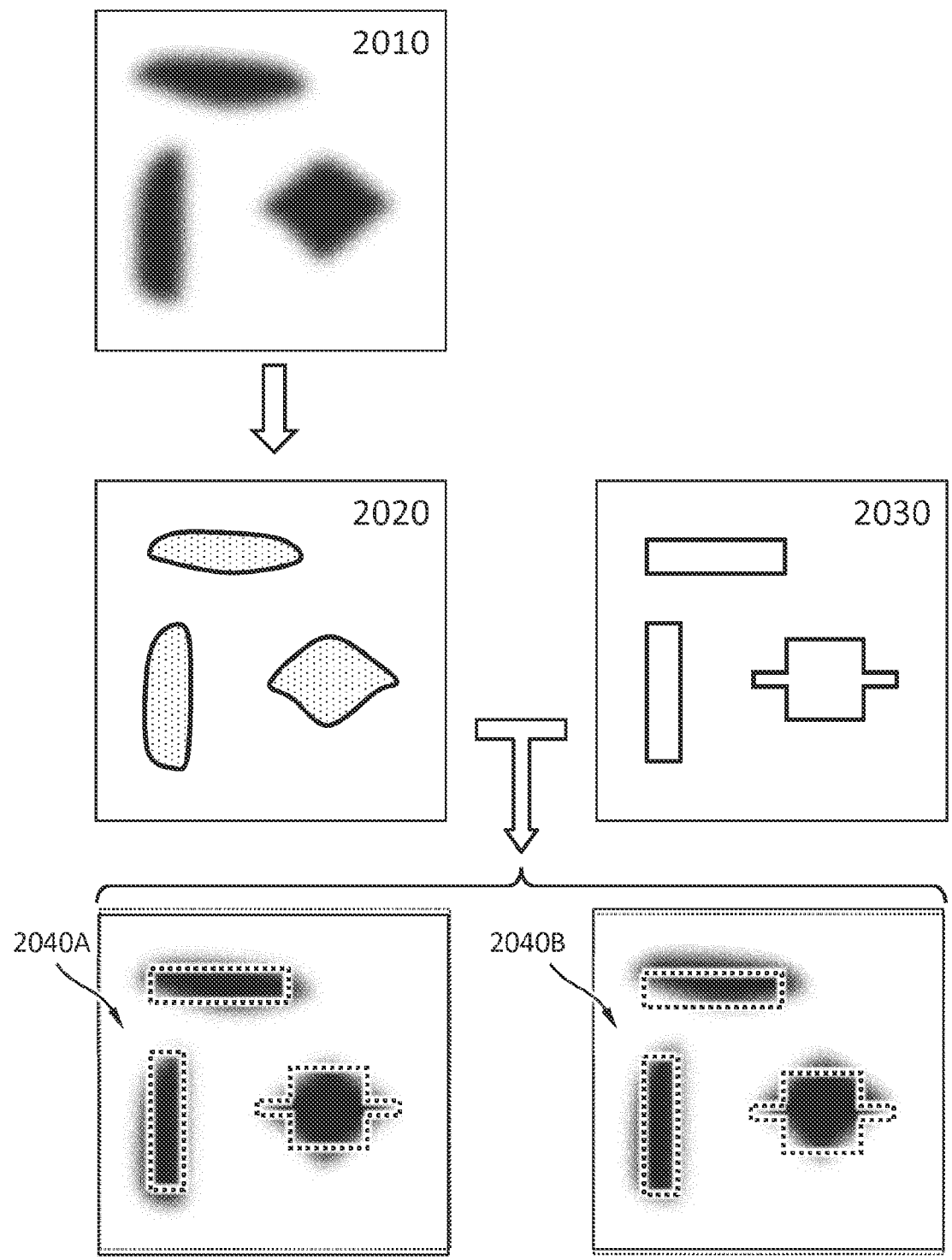
FIG. 3 schematically shows a process of aligning an image to a portion of a design layout.

FIG. 3 schematically shows a process of aligning an image to a portion of a design layout. An image 2010 is obtained, for example, from an inspection apparatus of the metrology system. The image 2010 may be a metrology image of patterns formed on a substrate from the portion of the design layout using a patterning process. The image 2010 may be a pixelated image such as a SEM image. Contours 2020 may be identified from the image 2010, using a suitable edge detection algorithm. The contours 2020 represent the edges of the patterns on the substrate. The contours 2020 and the portion of the design layout 2030 are used to determine a mapping between the portion of the design layout 2030 and the image 2010 for aligning the portion of the design layout 2030 and the image 2010. The word "mapping" here may represent relative translation, relative rotation, relative scaling, relative skewing or other relative deformation, which may be applied to the image 2010 before the image 2010 and the portion of the design layout 2030 are aligned. There may be multiple mappings that are all reasonable, which result in multiple different alignments (e.g., 2040A and 2040B) of the portion of the design layout 2030 and the image 2010. In the different alignments, the parameters of the patterned substrate measured by the metrology system may have different values. The difference in the values of the parameters is a result of the uncertainty of the alignment.

There may be multiple ways to use the contours 2020 and the portion of the design layout 2030 to determine the mapping between them. For example, a cost function may be defined to characterize deviations of corresponding mapping references (e.g., edges, corners) in the contours 2020 and in the portion of the design layout 2030. The term "mapping reference" as used herein means a portion of a design layout or of an image, based on which the mapping between the design layout and the image is determined. In an example, the cost function may be expressed as $$CF(m) = \Sigma_{p=1}^{P} w_p f_p^2(m) \quad \text{(Eq. 1)}$$

wherein m is the mapping and $f_p(m)$ can be a function of the mapping m. For example, $f_p(m)$ can be a deviation between a mapping reference in the contours 2020 and a corresponding mapping reference in the portion of the design layout 2030. The deviation here may include relative translation, relative rotation, relative scaling, relative skewing or other relative deformation. $w_p$ is a weight constant associated with $f_p(m)$. EPE is one example of $f_p(m)$. Different $f_p(m)$ may have equal weight $w_p$, especially when there is no reason to favor some $f_p(m)$ relative to others. Of course, CF(m) is not limited to the form in Eq. 1. CF(m) can be in any other suitable form. The mapping m may be one that minimizes or maximizes the cost function CF(m).

Not all of the mapping references of the design layout may be produced on a substrate with equal accuracy by a patterning process. Some of the mapping references of the design layout may have large deviations from the corresponding mapping references of the patterns produced on the substrate. The deviations may have multiple origins. One origin can be a resolution enhance technique (RET). In order to relatively accurately produce patterns with dimensions smaller than the classical resolution limit of a lithographic projection apparatus, sophisticated fine-tuning steps may be applied to the lithographic projection apparatus and/or the design layout. RETs may include, for example, but not limited to, optimization of NA and optical coherence settings, customized illumination schemes, use of assist features, use of phase shifting patterning devices, optical proximity correction (OPC) in the design layout, etc. RETs may not be perfect and may contribute to the deviations.

Another origin can be inaccuracy of the patterning device (sometimes called "mask errors"). After the design layout is modified by a RET, it can be formed on or by a patterning device. This process may have errors. Namely, a patterns as a result of a RET may not be accurately formed on or by the patterning device. For example, a pattern formed on or by the patterning device may have a deformation such as a translation of edges of the pattern, a translation of the pattern, a rotation of edges of the pattern, scaling of the pattern, and/or skewing of the pattern, relative to the design layout or the post-RET layout.

Yet another origin can be the patterning process, including a lithographic projection apparatus used therein. The patterning process may have various errors. Examples of errors may include that the resist used on the substrate has a development rate higher than normal, that a radiation source output is lower than normal, that a component in the projection optics is deformed due to heating, and/or a stochastic effect of photon shot noise.

At least a portion of a deviation between a mapping reference of the design layout and the corresponding mapping reference of the pattern produced on the substrate may be simulated using one or more models, based on characteristics of the patterning process (including the lithographic apparatus) and the design layout. The simulation may provide information that can be used to determine the mapping between a metrology image (e.g., image 2010) and the design layout (e.g., the portion 2030).

Figure 4:
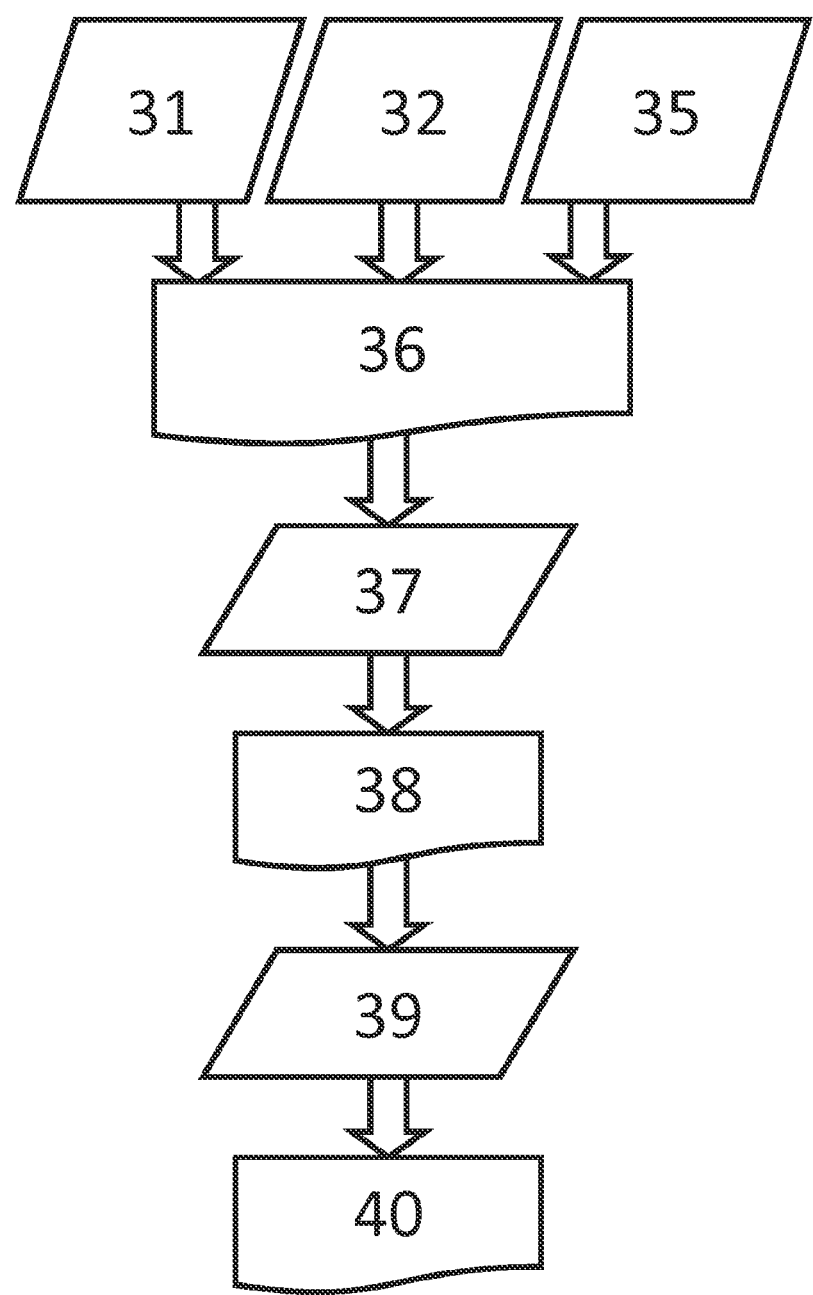
FIG. 4 schematically shows a simulation flow chart.

FIG. 4 schematically shows a simulation flow chart. A source model 31 represents one or more optical characteristics (including radiation intensity distribution and/or phase distribution) of illumination. A projection optics model 32 represents one or more optical characteristics (including changes to the radiation intensity distribution and/or the phase distribution caused by the projection optics) of the projection optics. A patterning device model 35 represents one or more optical characteristics of the patterning device (including changes to the radiation intensity distribution and/or the phase distribution caused by a given design layout represented on the patterning device). An aerial image 36 can be simulated from the source model 31, the projection optics model 32 and the patterning device model 35. A resist image 38 can be simulated from the aerial image 36 using a resist model 37. The resist model 37 represents physical and chemical properties of the resist (e.g., behavior of the resist in exposure, post exposure bake and development). An etch image 40 can be simulated from the resist image 38 using an etching model 39. The etching model 39 represents characteristics of the etching process of the substrate.

More specifically, the source model 31 can represent one or more optical characteristics of the illumination including, but not limited to, a numerical aperture setting, an illumination sigma (σ) setting and/or a particular illumination shape (e.g. off-axis illumination such as annular, quadrupole, dipole, etc.). The projection optics model 32 can represent one or more optical characteristics of the projection optics, including aberration, distortion, one or more refractive indices, one or more physical sizes, one or more physical dimensions, etc. The patterning device model 35 can represent one or more physical properties of a physical patterning device, as described, for example, in U.S. Pat. No. 7,587,704, which is incorporated by reference in its entirety. The etching model 39 can represent one or more characteristics of the etching process such as gas composition, (microwave) power, duration, one or more materials of the substrate, etc.

The source model 31, the projection optics model 32, the patterning device model 35, and the etching model 39 may model contributions of the patterning process to deviations of the aerial, resist or etched image from the design layout. The patterning device model 35 may model the contribution of the RETs and inaccuracy of the patterning device to deviations of the aerial, resist or etched image from the design layout. The various models may be obtained at least partially from experimental data.

The simulation does not have to simulate a portion of the aerial, resist or etched image; it can simulate one or more various characteristics thereof. For example, the simulation may simulate one or more geometrical characteristics (position, orientation, or size) of a mapping reference in the aerial, resist or etched image.

Although the simulation may not be perfect, in the sense that it may not predict every detail of a pattern produced on a substrate by a patterning process, it still can provide information about the deviation of one or more mapping references of a pattern produced on the substrate relative to the design layout. The one or more mapping references that have large deviations from the design layout as predicted by the simulation should play a lesser role in the alignment of a metrology image (e.g., image 2010) and the design layout (e.g., the portion 2030).

Figure 5A:
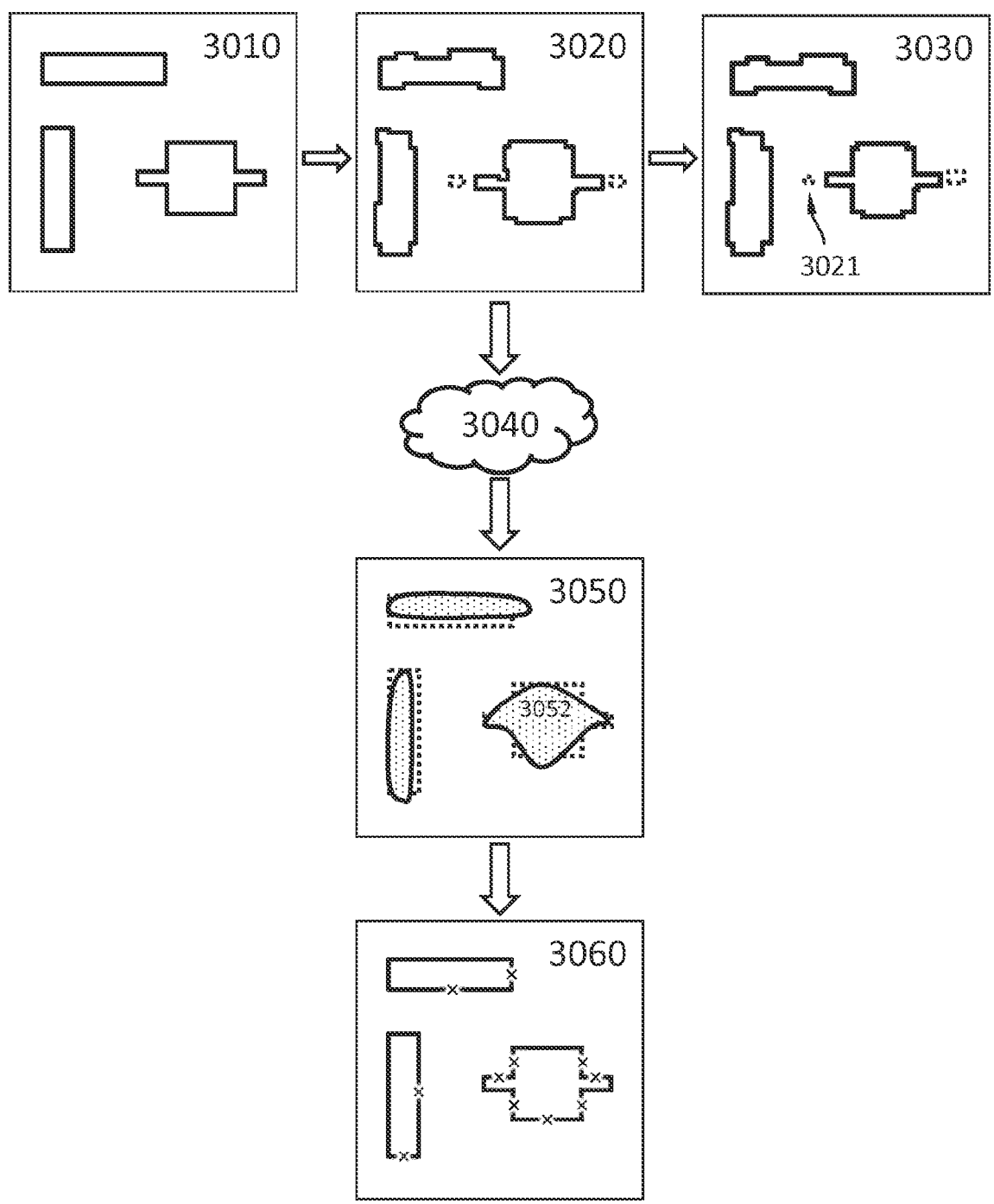
FIG. 5A and FIG. 5B schematically show an example of using the simulation to determine the mapping between a metrology image and the design layout, according to an embodiment.
Figure 5B:
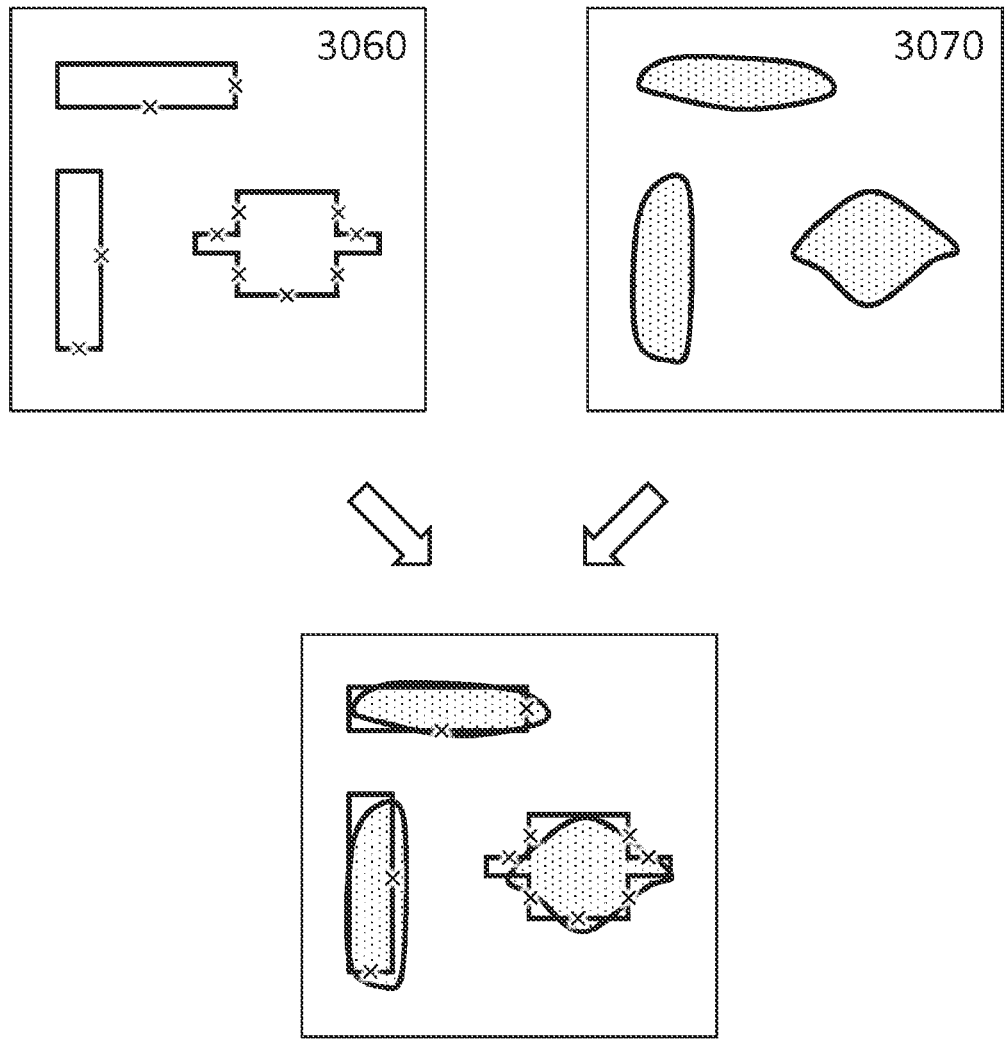

FIG. 5A and FIG. 5B schematically show an example of using the simulation to determine the mapping between a metrology image and the design layout, according to an embodiment. A RET (e.g., OPC) changes a design layout 3010 to a post-RET layout 3020. The some of the patterns in the design layout 3010 may be altered and assist features (e.g., 3021) may be added by the RET. The post-RET layout 3020 is then formed on or by a patterning device 3030, which may have inaccuracy relative to the post-RET layout 3020. In this example shown in FIG. 5A, the assist features as formed on or by the patterning device 3030 are smaller than those in the post-RET layout 3020. The patterning device 3030 is used in a patterning process 3040. The simulation can use information (e.g., through the models 31, 32 and 35) and produce contours 3052 in an image (e.g., aerial, resist or etched image) 3050 or one or more characteristics thereof. The contours 3052 and the design layout 3010 may be compared to determine a deviation between one or more mapping references of the design layout and the corresponding one or more mapping references of the contours 3052. One or more of the edges (as examples of mapping references) of the design layout have large deviations and are marked with crosses in 3060. The corresponding one or more mapping references of a metrology image to these one or more mapping references of the design layout with large deviations, if relied on heavily in the determination of the mapping between the metrology image and the design layout, may cause large errors in the alignment. Therefore, these one or more mapping references of the design layout with large deviations may be relied on to a lesser degree (e.g., with lesser weights) in the determination of the mapping than one or more other mapping references of the design layout, or not relied on at all (i.e., with weights of zero).

FIG. 5B schematically shows an example where the design layout and contours 3070 identified from a metrology image are aligned, with the one or more mapping references of the design layout with large deviations in the simulation relied on to a lesser degree than one or more other mapping references.

Figure 6A:
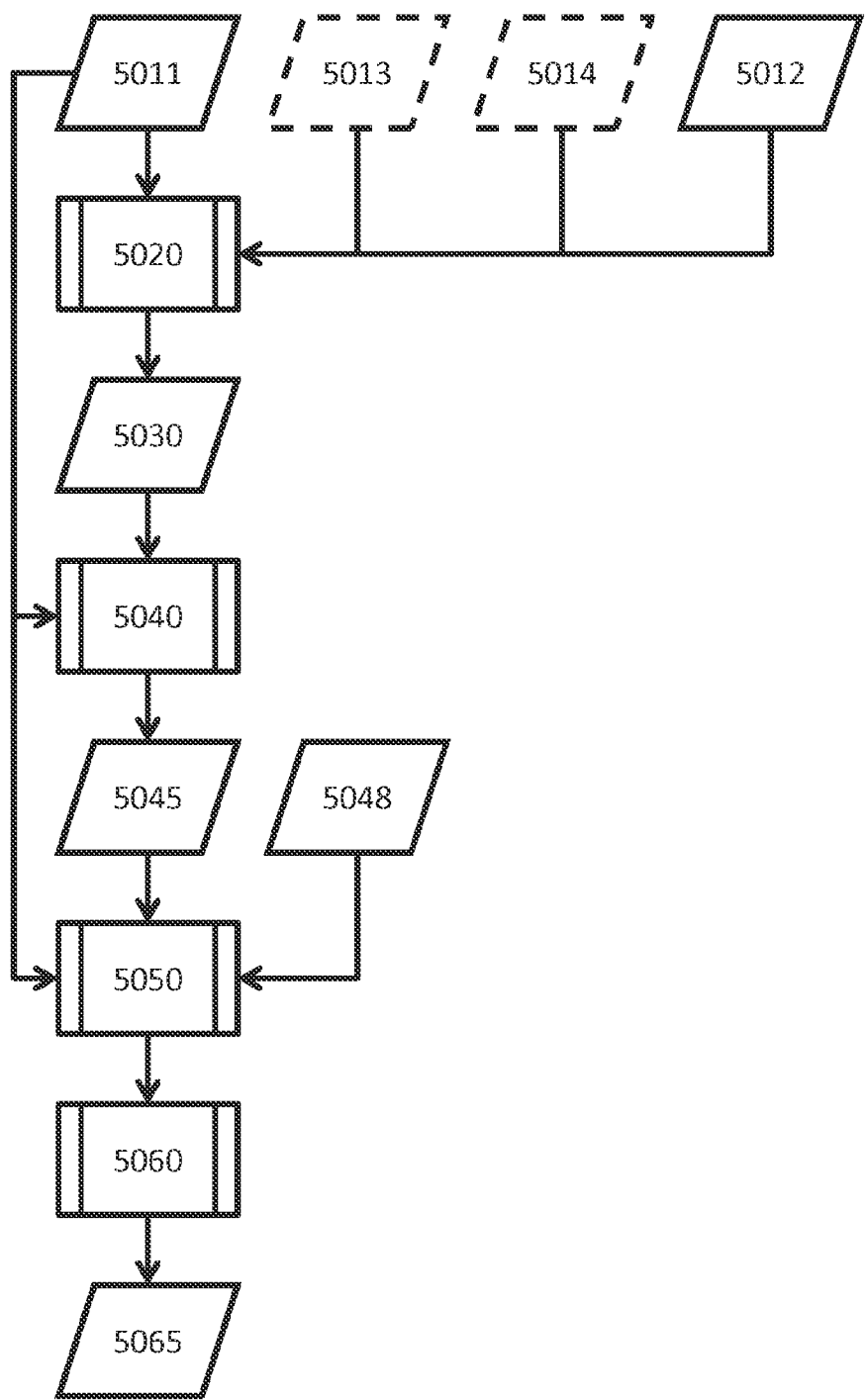
FIG. 6A schematically shows a flow chart for a method of aligning a portion of a design layout and a metrology image obtained from a patterned substrate, according to an embodiment.

FIG. 6A schematically shows a flow chart of a method of aligning a portion of a design layout and a metrology image obtained from a patterned substrate, according to an embodiment. The patterned substrate comprises patterns produced from the design layout using the patterning process. Characteristics of the design layout 5011, of a patterning process 5012, optionally of one or more RETs 5013, and optionally of inaccuracy of the patterning device 5014, which are used in producing the patterned substrate, are used in a simulation process 5020, which produces an image (e.g., an aerial, resist or etched image) or one or more characteristics thereof 5030. One or more deviations 5045 (e.g., one or more deviations between one or more mapping references of the design layout 5011 and the corresponding one or more mapping references of the simulated image) between the simulated image or one or more characteristics thereof 5030, and the design layout 5011 or characteristics thereof are determined, in procedure 5040. The metrology image 5048 and the design layout 5011 are aligned in procedure 5050 based on the one or more deviations 5045. In procedure 5060, one or more parameters (e.g., EPEs) 5065 of the patterned substrate are determined from the metrology image 5048 aligned with the design layout 5011. The design layout, the RETs, the patterning device, and/or the patterning process may be adjusted based on the parameters 5065.

Figure 6B:
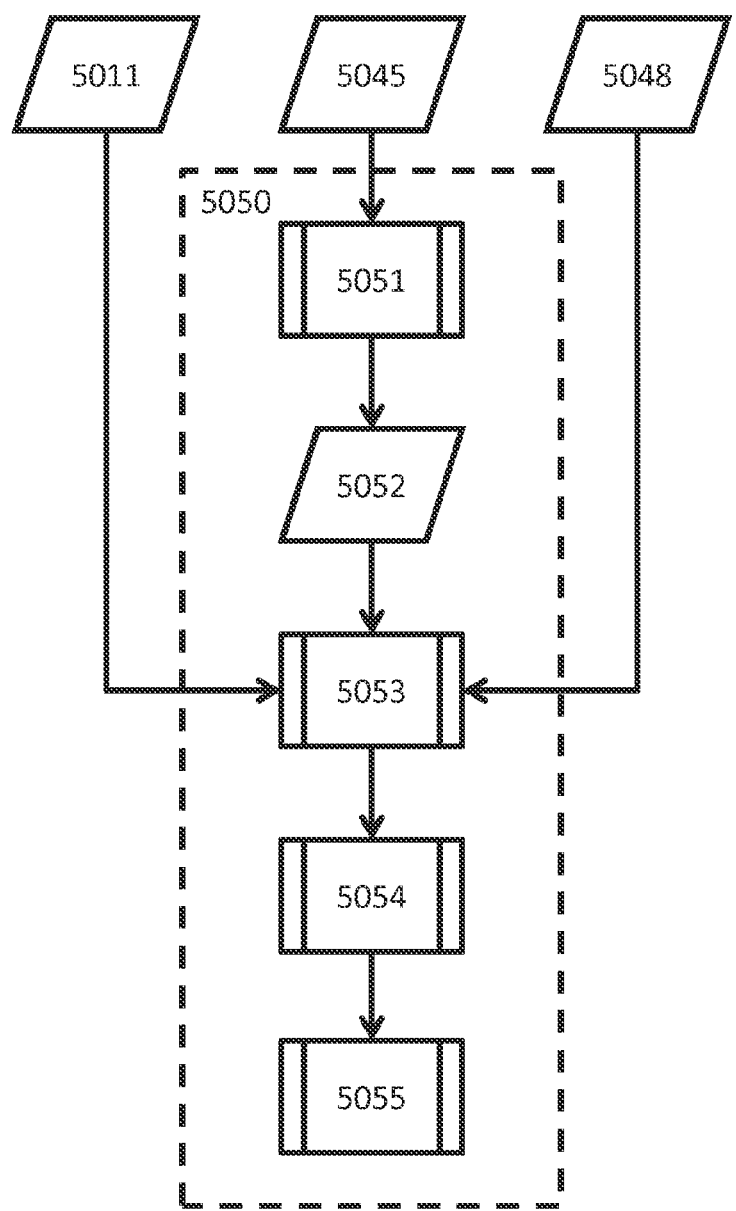
FIG. 6B schematically shows details of procedure 5050 of FIG. 6A.

FIG. 6B schematically shows details of procedure 5050, where the metrology image 5048 and the design layout 5011 are aligned based on the one or more deviations 5045 between the simulated image or characteristics thereof 5030, and the design layout or characteristics thereof 5011, according to an embodiment. In procedure 5051, one or more weights 5052 for the one or more deviations 5045 (e.g., deviations between corresponding mapping references of the design layout and of the simulated image) are determined based on one or more characteristics (e.g., magnitude) of the one or more deviations 5045. For example, weights for those deviations 5040 with larger magnitudes may be smaller. For example, if the magnitude of one or more of the deviations 5040 is above a threshold, those one or more deviations may be entirely disregarded (i.e., having weight of zero) in the determination of the mapping between the design layout 5011 and the metrology image 5048. In procedure 5053, a cost function (e.g., Eq. 1) that characterizes at least some of the deviations between the design layout 5011 and the metrology image 5048 and is a function of the mapping is computed using the weights 5052. In procedure 5054, the mapping between the design layout 5011 and the metrology image 5048 is adjusted based on the cost function (e.g., such that the cost function is minimized or maximized). In procedure 5055, the metrology image 5048 and the design layout 5011 are aligned using the mapping.

Figure 7:
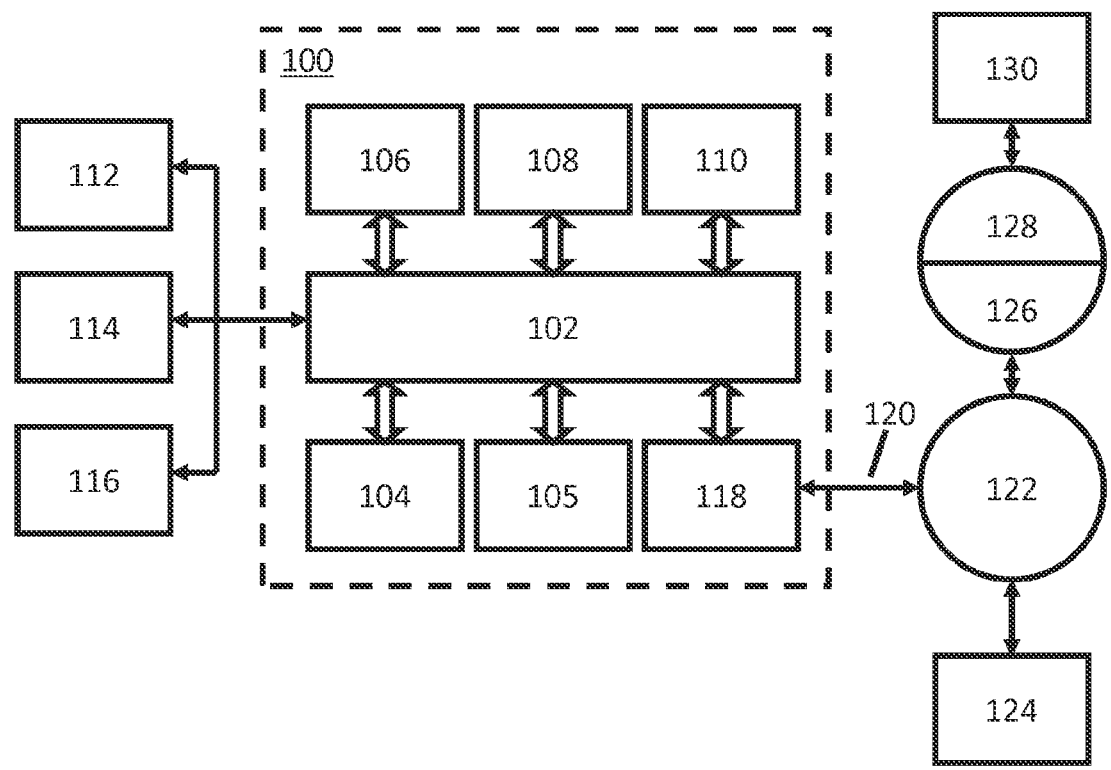
FIG. 7 is a block diagram of an example computer system.

FIG. 7 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a method as described herein, for example. The received code may be executed by processor 104 as it is received, and/or stored in storage device 110, or other non-volatile storage for later execution. In this manner, computer system 100 may obtain application code in the form of a carrier wave.

The embodiments may further be described using the following clauses:

1. A method comprising:
   simulating an image or one or more characteristics thereof, using characteristics of a design layout and of a patterning process,
   determining a deviation between the image or one or more characteristics thereof and the design layout or one or more characteristics thereof;
   aligning a metrology image obtained from a patterned substrate and the design layout based on the deviation, wherein the patterned substrate comprises a pattern produced from the design layout using the patterning process; and
   determining a parameter of a patterned substrate from the metrology image aligned with the design layout.

2. The method of clause 1, further comprising adjusting the design layout, a patterning device comprising the design layout, and/or the patterning process, based on the parameter.

3. The method of clause 1 or clause 2, wherein simulating the image or one or more characteristics thereof further comprises using one or more characteristics of a resolution enhancement technique or of a patterning device.

4. The method of clause 3, wherein the resolution enhancement technique is configured to place an assist feature into the design layout.

5. The method of clause 3, wherein the one or more characteristics of the patterning device comprise a deformation of a pattern on the patterning device.

6. The method of any of clauses 1 to 5, wherein the deviation is between one or more mapping references of the design layout and corresponding one or more mapping references of the image.

7. The method of clause 6, wherein the one or more mapping references comprises an edge in a contour.

8. The method of any of clauses 1 to 7, wherein the image is an aerial image, a resist image or an etched image.

9. The method of any of clauses 1 to 8, wherein the deviation comprises an edge placement error.

10. The method of any of clauses 1 to 9, wherein the metrology image is a scanning electron microscopy image.

11. The method of any of clauses 1 to 10, wherein the metrology image is a pixelated image.

12. The method of any of clauses 1 to 11, wherein aligning the metrology image and the design layout comprises identifying a contour from the metrology image.

13. The method of any of clauses 1 to 12, wherein aligning the metrology image and the design layout comprises:
   determining weights for a plurality of deviations based on a characteristic of the deviations;
   computing a cost function that characterizes at least some of the deviations and is a function of a mapping between the design layout and the metrology image;
   adjusting the mapping based on the cost function; and
   aligning the metrology image and the design layout using the mapping.

14. The method of clause 13, wherein the characteristic of the deviations comprises a magnitude of the deviations.

15. The method of clause 13 or clause 14, wherein adjusting the mapping based on the cost function comprises adjusting the mapping such that the cost function is minimized or maximized.

16. The method of any of clauses 13 to 15, wherein at least one of the weights is zero.

17. The method of any of clauses 13 to 16, wherein the mapping represents one or more relative deformations between the metrology image and the design layout.

18. A non-transitory computer program product comprising machine-readable instructions for causing a processor to cause performance of the method of any of clauses 1 to 17.

Although specific reference may be made in this text to the use of embodiments in the context of metrology or inspection apparatus used to inspect or measure items in association with, e.g., optical lithography and/or manufacture of ICs, it will be appreciated that the methods and apparatus described herein may be used in other applications, for example imprint lithography, the use or manufacture of integrated optical systems, the use or manufacture of guidance and detection patterns for magnetic domain memories, the use or manufacture of flat-panel displays, the use or manufacture of liquid-crystal displays (LCDs), the use or manufacture of thin film magnetic heads, etc.

The substrate referred to herein may be processed, before or after exposure/patterning, in for example a track (a tool that typically applies a layer of resist to a substrate and develops the patterned/exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed or unprocessed layers.

Although specific reference may have been made above to the use of embodiments of the disclosure in the context of optical lithography, it will be appreciated that the disclosure may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of less than about 400 nm and greater than about 20 nm, or about 365, 355, 248, 193, 157 or 126 nm), extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and/or electrostatic optical components.

While specific embodiments have been described above, it will be appreciated that the disclosure may be practiced otherwise than as described. For example, an embodiment may take the form of a computer program containing one or more sequences of machine-readable instructions describing a method as disclosed above, or a non-transitory data storage medium (e.g. semiconductor memory, magnetic or optical disk) having such a computer program stored therein, or a transitory medium having such a computer program therein. Further, the machine readable instruction may be embodied in two or more computer programs. The two or more computer programs may be stored on one or more different data storage media.

The descriptions above are intended to be illustrative, not limiting. Thus, it will be apparent to one skilled in the art that modifications may be made to the disclosure as described without departing from the scope of the claims set out below.

What is claimed is:

1. A method comprising:
   aligning, by a hardware computer, a design layout and a captured image of a pattern on a substrate, the pattern produced on the substrate from the design layout using a patterning process, the aligning being based on a difference between the design layout, or one or more characteristics thereof, and an image, or one or more characteristics thereof, produced by a simulation using characteristics of the design layout and of the patterning process; and
   determining a shift of at least part of the pattern from the captured image aligned with the design layout.

2. The method of claim 1, further comprising adjusting the design layout, a patterning device comprising the design layout, and/or the patterning process, based on the shift.

3. The method of claim 1, wherein the simulation further uses one or more characteristics of a resolution enhancement technique or of a patterning device.

4. The method of claim 3, wherein the simulation uses one or more characteristics of the resolution enhancement technique and the resolution enhancement technique is configured to place an assist feature into the design layout.

5. The method of claim 3, wherein the simulation uses one or more characteristics of the patterning device and the one or more characteristics of the patterning device comprise a deformation of a pattern on the patterning device.

6. The method of claim 1, wherein the difference is between one or more mapping references of the design layout and corresponding one or more mapping references of the image produced by the simulation.

7. The method of claim 6, wherein the one or more mapping references comprises an edge in a contour.

8. The method of claim 1, wherein the difference comprises an edge placement error.

9. The method of claim 1, wherein the captured image is a scanning electron microscopy image, and/or wherein the captured image is a pixelated image.

10. The method of claim 1, wherein aligning the captured image and the design layout comprises identifying a contour from the captured image.

11. The method of claim 1, wherein aligning the captured image and the design layout comprises:
    determining weights for a plurality of differences based on a characteristic of the differences;
    computing a cost function that characterizes at least some of the differences and is a function of a mapping between the design layout and the captured image;
    adjusting the mapping based on the cost function; and
    aligning the captured image and the design layout using the mapping.

12. The method of claim 11, wherein the characteristic of the differences comprises a magnitude of the differences.

13. The method of claim 11, wherein at least one of the weights is zero.

14. The method of claim 11, wherein the mapping represents one or more relative deformations between the captured image and the design layout.

15. A non-transitory computer program product comprising machine-readable instructions therein, the instructions, upon execution by a processor system, configured to cause the processor system to at least:
    align a design layout and a captured image of a pattern on a substrate, the pattern produced on the substrate from the design layout using a patterning process, the alignment being based on a difference between the design layout, or one or more characteristics thereof, and an image, or one or more characteristics thereof, produced by a simulation using characteristics of the design layout and of the patterning process; and
    determine a shift of at least part of the pattern from the captured image aligned with the design layout.

16. The computer program product of claim 15, wherein the difference is between one or more mapping references of the design layout and corresponding one or more mapping references of the image produced by the simulation.

17. The computer program product of claim 15, wherein the instructions are further configured to adjust the design layout, a patterning device comprising the design layout, and/or the patterning process, based on the shift.

18. The computer program product of claim 15, wherein the instructions configured to cause the processor system to align the captured image and the design layout are further configured to cause the processor to use a contour from the captured image to align the captured image and the design layout.

19. The computer program product of claim 15, wherein the instructions configured to align the captured image and the design layout are further configured to cause the processor system to:
    determine weights for a plurality of differences based on a characteristic of the differences;
    compute a cost function that characterizes at least some of the differences and is a function of a mapping between the design layout and the captured image;
    adjust the mapping based on the cost function; and
    align the captured image and the design layout using the mapping.

20. A non-transitory computer program product comprising machine-readable instructions therein, the instructions, upon execution by a processor system, configured to cause the processor system to at least:
    align a design layout and a captured image of a pattern on a substrate, the pattern produced on the substrate from the design layout using a patterning process, the alignment being based on an evaluation between one or more characteristics of the design layout and one or more characteristics of an image produced by a simulation using characteristics of the design layout and of the patterning process; and
    determine a shift of at least part of the pattern from the captured image aligned with the design layout.

21. The computer program product of claim 20, wherein the evaluation is between one or more mapping references of the design layout and corresponding one or more mapping references of the image produced by the simulation.

22. The computer program product of claim 20, wherein the instructions are further configured to adjust the design layout, a patterning device comprising the design layout, and/or the patterning process, based on the shift.

23. The computer program product of claim 20, wherein the instructions configured to cause the processor system to align the captured image and the design layout are further configured to cause the processor to use a contour from the captured image to align the captured image and the design layout.

24. The computer program product of claim 20, wherein the instructions configured to align the captured image and the design layout are further configured to cause the processor system to:
- determine weights for a plurality of evaluations between one or more characteristics of the design layout and one or more characteristics of an image produced by a simulation based on a characteristic of the evaluations;
- compute a cost function that characterizes at least some of the evaluations and is a function of a mapping between the design layout and the captured image;
- adjust the mapping based on the cost function; and
- align the captured image and the design layout using the mapping.

\* \* \* \* \*